United States Patent [19]

Smigelski

[11] Patent Number: 5,796,355
[45] Date of Patent: Aug. 18, 1998

[54] TOUCH SWITCH

[75] Inventor: Thomas Smigelski, Lake Zurich, Ill.

[73] Assignee: Zurich Design Laboratories, Inc., Hoffman Estates, Ill.

[21] Appl. No.: 699,045

[22] Filed: Aug. 30, 1996

Related U.S. Application Data

[63] Continuation-in-part of Ser. No. 645,228, May 13, 1996.

[51] Int. Cl.[6] .................................................. H03M 11/00
[52] U.S. Cl. .......................... 311/33; 307/116; 361/181; 200/600
[58] Field of Search ........................ 341/33; 307/116, 307/652; 327/172; 361/181; 200/600

[56] References Cited

U.S. PATENT DOCUMENTS

| | | |
|---|---|---|
| 3,261,944 | 7/1966 | Sherwood . |
| 3,435,313 | 3/1969 | Siefert et al. . |
| 3,639,869 | 2/1972 | Pedersen . |
| 3,696,409 | 10/1972 | Braaten . |
| 3,736,467 | 5/1973 | Meier et al. . |
| 3,986,144 | 10/1976 | Russo . |
| 4,001,536 | 1/1977 | Eberhardt ............................ 341/33 |
| 4,053,789 | 10/1977 | Schultz ............................ 307/116 |
| 4,081,700 | 3/1978 | Hamilton, II . |
| 4,103,252 | 7/1978 | Bobick . |
| 4,186,362 | 1/1980 | Kondo et al. . |
| 4,254,451 | 3/1981 | Cochran, Jr. . |
| 4,257,117 | 3/1981 | Besson ............................ 341/33 |
| 4,288,836 | 9/1981 | Thornburg et al. . |
| 4,289,980 | 9/1981 | McLaughlin . |
| 4,295,118 | 10/1981 | Herr et al. . |
| 4,322,631 | 3/1982 | Spofford . |
| 4,389,583 | 6/1983 | Walber ............................ 322/47 |
| 4,495,485 | 1/1985 | Smith ............................ 341/33 |
| 4,584,519 | 4/1986 | Grudts ............................ 307/116 |
| 4,595,913 | 6/1986 | Aubuchon ............................ 341/33 |
| 4,694,279 | 9/1987 | Meno . |
| 4,748,756 | 6/1988 | Ross . |
| 4,825,181 | 4/1989 | Nagano et al. . |
| 4,926,062 | 5/1990 | Ussery ............................ 307/116 |
| 4,939,382 | 7/1990 | Gruodis . |
| 5,037,105 | 8/1991 | Klein . |
| 5,131,775 | 7/1992 | Chen . |
| 5,233,323 | 8/1993 | Burkett et al. . |
| 5,405,208 | 4/1995 | Hsieh . |
| 5,455,749 | 10/1995 | Ferber . |
| 5,463,537 | 10/1995 | Trattner et al. . |
| 5,465,197 | 11/1995 | Chien . |
| 5,498,914 | 3/1996 | DeBoer ............................ 307/116 |

OTHER PUBLICATIONS

Copy of Packaging for LACE–LITES sneaker lighting.
Copy of brochure for "Ultimate Super Bright Light Set With Memory".
Copy of Advertisement for XENONLINE tubes and FLASH LINE flashing system.

*Primary Examiner*—Brian Zimmerman
*Assistant Examiner*—Albert K. Wong
*Attorney, Agent, or Firm*—Wallenstein & Wagner, Ltd.

[57] ABSTRACT

A touch switch (10) having multiple states, wherein an individual's body capacitance and/or body resistance is used to change the state of the switch.

13 Claims, 2 Drawing Sheets

TOUCH SWITCH

RELATED APPLICATION

This is a continuation-in-part of application Ser. No. 08/645,228, filed May 13, 1996.

TECHNICAL FIELD

The present invention relates generally to switches, and more particularly, to a touch switch having multiple states.

BACKGROUND OF THE INVENTION

Many "touch" switches are responsive to an individual's or animal's body capacitance. For example, U.S. Pat. No. 4,053,789 to Schultz discloses a system which is responsive to the touch of an animal and is activated by a combination of the inherent body capacity of the animal and the application of a skin resistance to a detector means.

Further, touch switches have been used to operate microwave oven controls, elevators controls and the like. For example, U.S. Pat. No. 4,001,536 to Eberhardt, Jr. discloses a control for a microwave oven in which cooking time is set by touching one of a number of touch plates on an oven control panel.

Some of these switches, however, have been unnecessarily complex. Accordingly, the present invention provides an alternative and relatively uncomplicated touch switch which uses the combination of an individual's body resistance and body capacitance to provide, in a first embodiment, three separate switch states. In a second embodiment, the invention uses an individual's body capacitance to provide two separate switch states.

SUMMARY OF THE INVENTION

It is an object of the present invention to provide a touch switch having multiple states which are based upon an individual's body capacitance and/or body resistance.

In accordance with the invention, in a first embodiment of the invention, the touch switch comprises a first oscillator for generating a high frequency reference signal having a first frequency, a second oscillator for generating a low frequency reference signal having a second frequency and a sensor oscillator for generating a reference signal having a reference signal frequency.

Initially, the reference signal frequency has a value between the first frequency and the second frequency. However, upon certain conditions, the reference signal frequency can be varied.

Specifically, the sensor oscillator has two probe points which are used in combination with an individual's body resistance and body capacitance to change the state of the switch.

First, when only one of the probe points has been "touched" or when the two probe points have been "touched" lightly by a human hand, a capacitive load is imposed at the probe points. As a result of the capacitive load, the reference signal frequency will be less than the second frequency.

Second, when the two probe points have been "touched" firmly by a human hand, the reference signal frequency will be greater than the first frequency due to the resistance of the system being reduced by the parallel resistance added by the human hand.

A first frequency detector is coupled to the first oscillator and the sensor oscillator to detect when the reference signal frequency has been varied such that it is greater than the first frequency, while a second frequency detector is coupled to the second oscillator and the sensor oscillator to detect when the reference signal frequency has been varied such that it is less than the second frequency.

Accordingly, in the first embodiment, the touch switch has three states: a first state when the value of the reference signal frequency is between the first frequency and the second frequency; a second state when the value of the reference signal frequency is greater than the first frequency; and, a third state when the value of the reference signal frequency is less than the second frequency.

In a second embodiment of the invention, the touch switch comprises a low frequency oscillator for generating a low frequency reference signal having a low frequency and a sensor oscillator for generating a reference signal having a reference signal frequency.

Initially, the reference signal frequency has a value greater than the low frequency. However, upon certain conditions, the reference signal frequency can be varied.

Specifically, the sensor oscillator has a probe point which is used in combination with an individual's body capacitance to change the state of the switch. Even more specifically, when the probe point is "touched" by a human hand, a capacitive load is imposed at the probe point. As a result of the capacitive load, the reference signal frequency becomes less than the low frequency.

A frequency detector is coupled to the low frequency oscillator and the sensor oscillator to detect when the reference signal frequency has been varied such that it is less than the low frequency.

Accordingly, in the second embodiment, the touch switch has two states: a first state when the value of the reference signal frequency is greater than the low frequency; and, a second state when the value of the reference signal frequency is less than the low frequency.

Other features and advantages of the invention will be apparent from the following specification taken in conjunction with the following drawings.

BRIEF DESCRIPTION OF THE DRAWINGS

In order that the present invention may be understood, it will now be described by way of example, with reference to the accompanying drawings in which.

DETAILED DESCRIPTION OF THE PREFERRED EMBODIMENT

Figure 1:
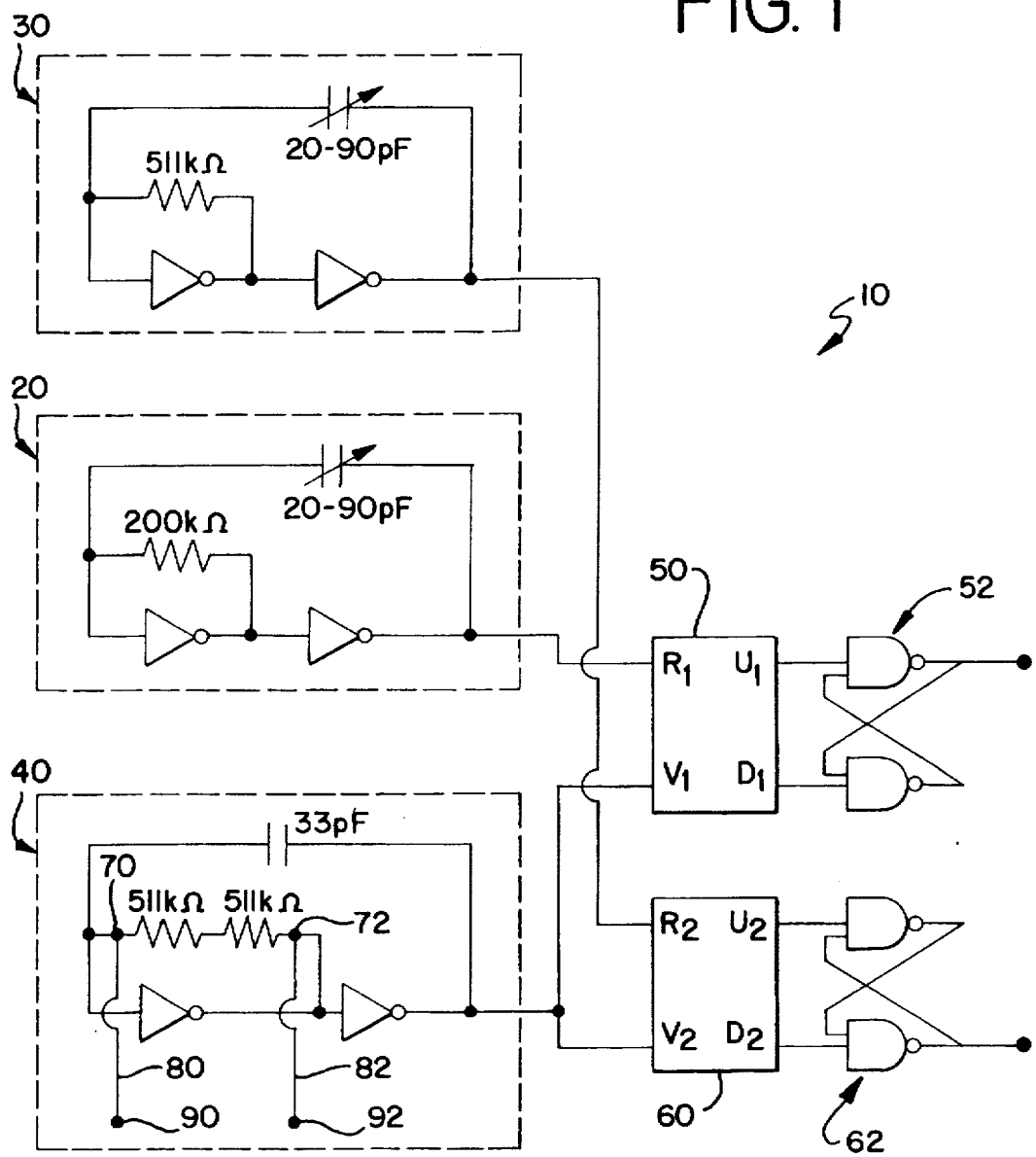
FIG. 1 is an electrical schematic representation of a first embodiment of the touch switch of the present invention; and, FIG. 2 is an electrical schematic representation of a second embodiment of the touch switch of the present invention.

While this invention is susceptible of embodiments in many different forms, there is shown in the drawings and will herein be described in detail, preferred embodiments of the invention with the understanding that the present disclosure is to be considered as an exemplification of the principles of the invention and is not intended to limit the broad aspects of the invention to the embodiments illustrated.

The touch switch of the present invention, generally designated by reference numeral 10, is shown in FIG. 1. The touch switch 10 comprises a first oscillator 20 for producing a high frequency reference signal $f_{high}$, a second oscillator 30 for producing a low frequency reference signal $f_{low}$, and a sensor oscillator 40 for producing an initial reference signal $f_{initial}$. The initial reference signal $f_{initial}$ has a frequency between the frequencies of the high and low frequency reference signals $f_{high}, f_{low}$.

The touch switch 10 also includes a first frequency detector 50 and associated first frequency comparator circuit 52, and a second frequency detector 60 and associated second frequency comparator circuit 62.

The first frequency detector 50 includes a first detector high-frequency input R1 from the first oscillator 20, first detector sensor input V1 from the sensor oscillator 40, a first detector high output U1 and a first detector low output D1.

Similarly, the second frequency detector 60 includes a second detector low-frequency input R2 from the second oscillator 30, second detector sensor input V2 from the sensor oscillator 40, a second detector high output U2 and a second detector low output D2.

Commercially available frequency detectors similar to MC4044-type frequency detectors are suitable for most applications of the device. As mentioned below, however, the invention is not intended to be limited to a circuit using such a chip since the touch switch can be manufactured as an integrated circuit.

The first frequency detector 50 will produce a train of low-going pulses on either first detector high output U1 or first detector low output D1, based upon which input frequency is higher, R1 or V1. The first frequency comparator circuit 52 in the form of an R-S latch holds the low-going output pulse in a steady-state condition.

Likewise, the second frequency detector 60 will produce a train of low-going pulses on either second detector high output U2 or second detector low output D2, based upon which input frequency is higher, R2 or V2. The second frequency comparator circuit 62 in the form of an R-S latch holds the low-going output pulse in a steady-state condition.

The sensor oscillator 40 has two probe points 70,72 which are electrically connected via conductors 80,82 to contact points 90,92, respectively. The contact points 90,92 merely make the probe points 70, 72 electrically accessible to a user.

The operation of the touch switch 10 will now be described. As mentioned above, the sensor oscillator 40 outputs a signal having a frequency $f_{initial}$ between frequency of the high frequency reference signal $f_{high}$ of the first oscillator 20 and the frequency of the low frequency reference signal $f_{low}$ of the second oscillator 30.

If only one of the contact points 90,92 is "touched" or if both of the contact points 90,92 are "touched" lightly by a human hand, a capacitive load is imposed at the respective probe points 70,72. As a result of the capacitive load, the output signal of the sensor oscillator 40 will have a frequency which is less than the frequency of the low frequency reference signal $f_{low}$. This causes a change in state of the second frequency detector 60 and, thus, a change in the output of the second frequency comparator circuit 62.

If both contact points 90, 92 are "touched" firmly by a human hand, the output signal of the sensor oscillator 40 will have a frequency which is greater than the frequency of the high frequency reference signal $f_{high}$ since the resistance of the system is reduced due to the parallel resistance added by the human hand. This causes a change in state of the first frequency detector 50 and, thus, a change at the output of the first comparator circuit 52.

Accordingly, the switch has three states: (1) when not touched; (2) when touched lightly or when only one probe point is touched; and, (3) when touched firmly.

Figure 2:
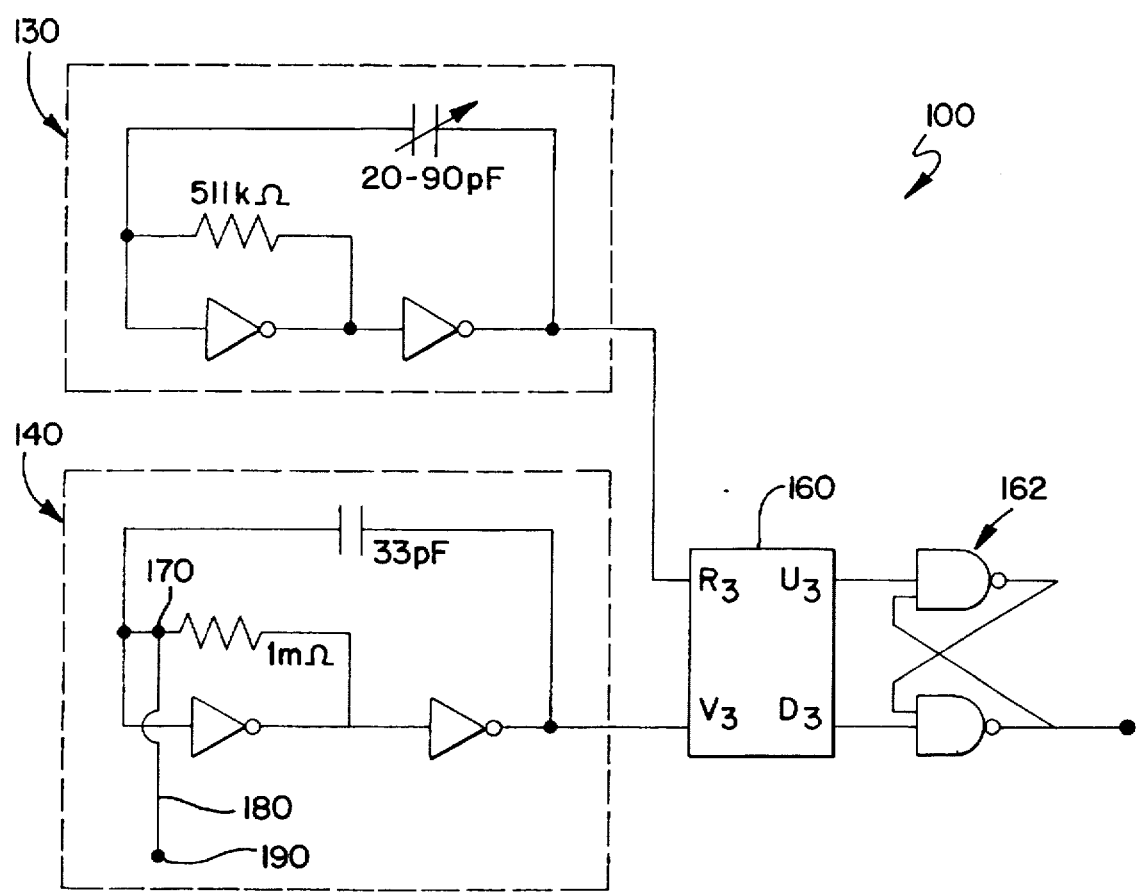

In a second embodiment of the invention, shown in FIG. 2, a touch switch 100 comprises a low frequency oscillator 130 for producing a low frequency reference signal $f_{low}$ and a sensor oscillator 140 for producing an initial reference signal $f_{initial}$. The initial reference signal $f_{initial}$ has a frequency above the frequency of low frequency reference signal $f_{low}$.

The touch switch 100 also includes a frequency detector 160 and associated frequency comparator circuit 162.

The frequency detector 160 includes a detector low-frequency input R3 from the low frequency oscillator 130, a detector sensor input V3 from the sensor oscillator 140, a detector high output U3 and a detector low output D3.

The frequency detector 160 will produce a train of low-going pulses on either detector high output U3 or detector low output D3, based upon which input frequency is higher, R3 or V3. The frequency comparator circuit 162 in the form of an R-S latch holds the low-going output pulse in a steady-state condition.

The sensor oscillator 140 has a probe point 170 which is electrically connected via conductor 180 to a contact point 190. The contact point 190 makes the probe point 170 electrically accessible to a user.

The operation of the touch switch 100 will now be described. As mentioned above, the sensor oscillator 140 outputs a signal $f_{initial}$ having a frequency greater than the frequency of the low frequency reference signal $f_{low}$ of the low frequency oscillator 130.

If the contact point 190 is "touched" by a human hand, a capacitive load is imposed at the probe point 170. As a result of the capacitive load, the output signal of the sensor oscillator 140 will be reduced such that it will have a frequency which is less than the frequency of the low frequency reference signal $f_{low}$. This causes a change in state of the frequency detector 160 and, thus, a change in the output of the frequency comparator circuit 162.

Accordingly, the switch has two states: (1) when not touched; and, (2) when the probe point is touched.

It should be understood that the touch switches shown in FIGS. 1 and 2 are only electrical schematic representations of the switches and that, in manufactured products, equivalents to the touch switch circuits shown in FIGS. 1 and 2 can be made in the form of integrated circuits.

It will be understood that the invention may be embodied in other specific forms without departing from the spirit or central characteristics thereof. The present embodiments, therefore, are to be considered in all respects as illustrative and not restrictive, and the invention is not to be limited to the details given herein.

I claim:

1. A touch switch comprising:

a first oscillator for generating a high frequency reference signal having a first frequency;

a second oscillator for generating a low frequency reference signal having a second frequency;

a sensor oscillator for generating a reference signal having a reference signal frequency, the reference signal frequency initially having a value between the first frequency and the second frequency, the sensor oscillator further including means for varying the reference signal frequency;

a first frequency detector, coupled to the first oscillator and the sensor oscillator, to detect when the reference signal frequency has been varied such that it is greater than the first frequency; and, a second frequency detector, coupled to the second oscillator and the sensor oscillator, to detect when the reference signal frequency has been varied such that it is less than the second frequency.

2. The touch switch of claim 1 wherein the means for varying the reference signal frequency includes first and second probe points.

3. The touch switch of claim 2 further including first and second conductors connected to first and second probe points, respectively, and first and second contact points connected to first and second conductors, respectively.

4. The touch switch of claim 3 further including a first comparator circuit electrically connected to the first frequency detector and a second comparator circuit electrically connected to the second frequency detector.

5. The touch switch of claim 1 wherein the touch switch has a first state when the value of the reference signal frequency is between the first frequency and the second frequency, a second state when the value of the reference signal frequency is greater than the first frequency, and a third state when the value of the reference signal frequency is less than the second frequency.

6. A touch switch comprising:

means for generating a high frequency reference signal having a first frequency;

means for generating a low frequency reference signal having a second frequency;

means for generating a reference signal having a reference signal frequency, the reference signal frequency initially having a value between the first frequency and the second frequency, the reference signal generating means further including means for varying the reference signal frequency;

a first frequency detector coupled to the high frequency signal generating means and the reference signal generating means to detect when the reference signal frequency has been varied such that it is greater than the first frequency; and, a second frequency detector coupled to the low frequency signal generating means and the reference signal generating means to detect when the reference signal frequency has been varied such that it is less than the second frequency.

7. The touch switch of claim 6 wherein the touch switch has a first state when the value of the reference signal frequency is between the first frequency and the second frequency, a second state when the value of the reference signal frequency is greater than the first frequency, and a third state when the value of the reference signal frequency is less than the second frequency.

8. A touch switch comprising:

a low frequency oscillator for generating a low frequency reference signal having a low frequency;

a sensor oscillator for generating a reference signal having a reference signal frequency, the reference signal frequency initially having a value greater than the low frequency;

means for varying the reference signal frequency; and, a frequency detector, coupled to the low frequency oscillator and the sensor oscillator, to detect when the reference signal frequency has been varied such that it is less than the low frequency.

9. The touch switch of claim 8 wherein the means for varying the reference signal frequency includes a probe point.

10. The touch switch of claim 9 further including a conductor connected to the probe point and a contact point connected to the conductor.

11. The touch switch of claim 10 further including a comparator circuit electrically connected to the frequency detector.

12. The touch switch of claim 11 wherein the touch switch has a first state when the value of the reference signal frequency is greater than the low frequency and a second state when the value of the reference signal frequency is less than the low frequency.

13. The touch switch of claim 12 wherein the switch is placed into its second state by the addition of a human's body capacitance.

* * * * *